(12) United States Patent
Park

(10) Patent No.: US 7,215,209 B2
(45) Date of Patent: May 8, 2007

(54) CONTROLLABLE IDLE TIME CURRENT MIRROR CIRCUIT FOR SWITCHING REGULATORS, PHASE-LOCKED LOOPS, AND DELAY-LOCKED LOOPS

(75) Inventor: Sangbeom Park, Tracy, CA (US)

(73) Assignee: ANA Semiconductor, Tracy, CA (US)

( * ) Notice: Subject to any disclaimer, the term of this patent is extended or adjusted under 35 U.S.C. 154(b) by 0 days.

(21) Appl. No.: 11/019,142

(22) Filed: Dec. 20, 2004

(65) Prior Publication Data

US 2006/0132208 A1 Jun. 22, 2006

(51) Int. Cl.
*H03L 7/00* (2006.01)
(52) U.S. Cl. .............. 331/17; 331/57; 331/DIG. 2; 327/153; 327/161
(58) Field of Classification Search .............. 331/17, 331/DIG. 2, 57; 327/153, 161
See application file for complete search history.

(56) References Cited

U.S. PATENT DOCUMENTS

| 6,229,403 B1 * | 5/2001 | Sekimoto | 331/57 |
| 2005/0046497 A1 * | 3/2005 | Nakanishi | 331/57 |

* cited by examiner

*Primary Examiner*—Robert Pascal
*Assistant Examiner*—Levi Gannon

(57) ABSTRACT

The four types of the controllable idle time current mirror circuits are presented with an improvement in productivity, performance, cost, chip area, power consumption, and design time. The controllable idle time current mirror circuits basically include a sensing block, triggering transistors, current mirror, current source, a n-bit control circuit array, and a feedback line. If the sensing voltage does not reach the expected voltage compared to the midpoint voltage of the sensing gate, the triggering transistors provide a current to its output through the current mirror until the voltage at feedback reaches the midpoint voltage. Time to reach the midpoint voltage at a load is simply equal to the charge stored at the load divided by the total current, which is controlled by an N-bit digital input and a device aspect ratio of each triggering transistor. Consequently, all controllable idle time current mirror circuits provide a controllable reduction in the difference between the initial condition and the expected condition in order to solve many drawbacks simultaneously. In addition, all the controllable idle time current mirror circuits within applied systems control how fast the applied systems come into regulation or lock. Thus, all the controllable idle time current mirror circuits presented achieve a fast controllable lock-in time, a short controllable start-up time, a controllable reduction in power and time, a significant reduction in design simulation time, an improvement in productivity, and a higher performance.

18 Claims, 10 Drawing Sheets

CONTROLLABLE IDLE TIME CURRENT MIRROR CIRCUIT FOR SWITCHING REGULATORS, PHASE-LOCKED LOOPS, AND DELAY-LOCKED LOOPS

FIELD OF THE INVENTION

The present invention relates to the field of controllable idle time current mirror circuit and more particularly to controllable idle time current mirror circuit for switching regulators, phase-looked loops, and delay-locked loops.

BACKGROUND ART

Switching regulators, phase-looked loops, delay-locked loops are vitally important devices. Switching regulators are building blocks used extensively in power systems, industry, motor, communication, networks, digital systems, consumer electronics, computers, and any other fields that high efficient voltage regulating functions. Phase-looked loops and delay-locked loops are building blocks used extensively in communication, networks, digital systems, consumer electronics, computers, and any other fields that require frequency synthesizing and synchronization.

Switching regulators (i.e., DC-TO-DC converters) can provide output voltages which can be less than, greater than, or of opposite polarity to the input voltage. Prior Art FIG. 1 illustrates a basic architecture of a conventional switching regulator 100. The conventional switching regulator 100 basically consists of an oscillator, a reference circuit, an error amplifier, a modulator including a comparator, resistors, and a control logic circuit. Control technique of switching regulators has typically used two modulators: a pulse-width modulator and a pulse-frequency modulator. The output dc level is sensed through the feedback loop including two resistors. An error amplifier compares this sampled output voltage and the reference voltage. The output of the error amplifier is compared against a periodic ramp generated by the saw tooth oscillator. The pulse-width modulator output passes through the control logic to the high voltage power switch. The feedback system regulates the current transfer to maintain a constant voltage within the load limits. In other words, it insures that the output voltage comes into regulation. However, it takes a long time until the regulated output reaches the equilibrium after the system starts. Since a power supply of a core processor is connected to one of the outputs of switching regulators in most system applications, even the core processor should stand by until it receives the regulated output from the switching regulator, too. Therefore, unfortunately, the conventional switching regulator 100 can not be efficiently implemented in system-on-chip (SOC), integrated circuit (IC), monolithic circuit, and discrete circuit since power and time are wasted until the output voltage of the switching regulator comes into regulation. In most switching regulator applications, it is highly desirable to control all switching regulators to start differently according to power sequence such as core-up-first and core-down-last. In addition, the slow start-up of the switching regulator increases design simulation time.

Thus, what is desperately needed is a cost-effective switching regulator that can attain a short controllable start-up time with an improvement in productivity, cost, chip area, power consumption, and design time. The present invention satisfies these needs by providing controllable idle time current mirror circuits utilizing a current mirror and a sensing gate, too.

The phase-looked loop is a very versatile building block suitable for a variety of frequency synthesis, clock recovery, and synchronization applications. Prior Art FIG. 2 illustrates a basic architecture of a conventional phase-locked loop. The conventional phase-locked loop 200 typically consists of a phase-frequency detector (or a phase detector), a charge-pump, a low-pass filter, a voltage-controlled oscillator, and a frequency divider in a loop. However, to understand phase-locked loops, phase-locked loops without any frequency dividers in a loop will be considered here. The phase-frequency detector (or a phase detector) is a block that has an output voltage with an average value proportional to the phase difference between the input signal and the output of the voltage-controlled oscillator. The charge-pump either injects the charge into the low-pass filter or subtracts the charge from the low-pass filter, depending on the outputs of the phase-frequency detector (or a phase detector). Therefore, change in the low-pass filter's output voltage is used to drive the voltage-controlled oscillator. The negative feedback of the loop results in the output of the voltage-controlled oscillator being synchronized with the input signal. As a result, the phase-locked loop is in lock.

In the conventional phase-locked loop of Prior Art FIG. 2, lock-in time is defined as the time that is required to attain lock from an initial loop condition. Assuming that the phase-locked loop bandwidth is fixed, the lock-in time is proportional to the initial difference frequency between the initial input signal frequency and the voltage-controlled oscillator's frequency as follows:

$$\frac{(\omega_{in}-\omega_{osc})^2}{\omega_0^3}$$

where $\omega_{in}$ is the input signal frequency, $\omega_{osc}$ is the voltage-controlled oscillator's frequency, and $\omega_0$ is the loop bandwidth. It should be noted that the lock-in time depends upon a loop bandwidth. If the loop bandwidth of a phase-locked loop is very wide, the lock-in time is very fast.

Most systems require different types of switching regulators, different types of phase-looked loops, and different types of delay-looked loops, which must be integrated on the same chip or board. For example, if two different phase-locked loops which have different bandwidths are used together on the same chip or board, they will result in different lock-in times. In addition, if an output signal of a phase-looked loop is assumed to be used as the input signal of another phase-looked loop, the output signal can not be accurate until both phase-looked loops are locked. Most reliable systems require a fast controllable lock-in time so that different phase-looked loops are locked quickly and synchronously. However, the conventional phase-locked loops including Prior Art FIG. 2 have recently suffered from slow uncontrollable lock-in time in most system applications. As a result, time and power of phase-looked loops are unnecessarily consumed because they are all slow-locking phase-locked loops. In addition, a conventional fast-locking phase-locked loop of Prior Art FIG. 3 is illustrated to overcome the slow-locking problem. The conventional fast-locking phase-locked loop consists of a digital phase-frequency detector including a 6-bit counter, a proportional-integral controller, a 10-bit digital-to-analog converter, and a voltage-controlled oscillator. Unfortunately, the conventional fast-locking phase-locked loop 300 is costly, complicated, and inefficient because additional blocks such as proportional-integral controller and 10-bit digital-to-analog converter take much more chip area and consume much more power. The conventional fast-locking phase-locked loop of Prior Art FIG. 3 has following disadvantages: requirement of complicated stability analysis, bad productivity, higher cost, larger chip area, much more power consumption, and longer design time. In addition, the conventional fast-locking phase-locked loop 300 of Prior Art FIG. 3 can not provide controllable lock-in time. Therefore, the conventional fast-locking phase-locked loop 300 can not be widely implemented in system-on-chip (SOC), integrated circuit (IC), monolithic integrated circuit, and discrete circuit.

Thus, what is desperately needed is a cost-effective phase-locked loop that can attain a fast controllable lock-in time with an improvement in all aspects. The present invention satisfies these needs by providing the controllable idle time current mirror circuits.

Delay-looked loops are typically employed for the purpose of synchronization. Prior Art FIG. 4 illustrates a basic architecture of a conventional delay-locked loop. A conventional delay-locked loop 400 typically consists of a phase detector, a charge-pump, a loop filter, and a voltage-controlled delay line. In delay-locked loops, the phase detector is a block that has an output voltage with an average value proportional to the phase difference between the input signal clock and the output clock at the end of delay line. The charge-pump either injects the charge into the loop filter or subtracts the charge from the loop filter, depending on the outputs of the phase detector. Therefore, change in the loop filter's output voltage will affect the delay time of the voltage-controlled delay line. If delay different from integer multiples of clock period is detected, the closed delay-locked loop will automatically correct it by changing the delay time of the voltage-controlled delay line.

It was just stated that most recent systems require different types of switching regulators, different types of phase-looked loops, and different types of delay-looked loops which must be integrated on the same chip or board. For example, if two delay-locked loops which have different bandwidths are used together, they will result in different lock-in times. In particular, if an output signal of a phase-looked loop is assumed to be used as the input signal of a delay-looked loop, the output signal of the delay-looked loop can not be accurate until the phase-locked loop are locked. Most reliable systems require a fast controllable lock-in time so that both phase-looked loops and delay-looked loops are locked synchronously and quickly. However, most conventional delay locked-loops including the conventional delay locked-loop 400 have suffered from slow-locking, harmonic locking, and uncontrollable locking. As a result, time and power of delay-looked loops are unnecessarily consumed until the delay-locked loops are locked. To overcome the slow-locking problem, a conventional fast-locking delay-locked loop of Prior Art FIG. 5 is illustrated. The conventional fast-locking delay-locked loop 500 basically consists of an analog phase detector, a charge-pump, a loop filter, a voltage-controlled delay lines, a digital phase detector, a 2-bit successive-approximation register (SAR), and a DCDL. Unfortunately, the conventional fast-locking delay-locked loop 500 is costly, complicated, and inefficient to be implemented in system-on-chip (SOC), integrated circuit (IC), monolithic circuit, and discrete circuit because additional blocks such as DCDL and 2-bit successive-approximation register (SAR) take much more chip area and consume much more power. In addition, the conventional fast-locking delay-locked loop of Prior Art FIG. 5 might improve the lock-in time, but certainly results in the following penalties: uncontrollable lock-in time, bad productivity, higher cost, larger chip area, much more power consumption, and longer design time. Thus, the conventional fast-locking delay-locked loop 500 can not be widely implemented in system-on-chip (SOC), integrated circuit (IC), monolithic circuit, and discrete circuit.

Thus, what is desperately needed is a cost-effective delay-locked loop that can attain a fast controllable lock-in time with an improvement in productivity, cost, chip area, power consumption, and design time. At the same time, what is desperately needed is a cost-effective circuit that enables both phase-locked loops and delay-locked loops to achieve fast controllable lock-in time, and enables switching regulator to achieve a short controllable start-up time with an improvement in all aspects. Lock-in time of phase-locked loops or start-up time of switching regulators can be termed "idle time". The present invention satisfies these needs by providing controllable idle time current mirror circuits, too.

In summary, unfortunately the conventional switching regulator 100 of Prior Art FIG. 1, the conventional phase-locked loop 200 of Prior Art FIG. 2, the conventional fast-locking phase-locked loop 300 of Prior Art FIG. 3, the conventional delay-locked loop 400 of Prior Art FIG. 4, and the conventional fast-locking delay-locked loop 500 of Prior Art FIG. 5 are very inefficient to be implemented in system-on-chip (SOC), integrated circuit (IC), monolithic circuit, and discrete circuit. In addition, those integrated circuits 100, 200, 300, 400, and 500 have taken a long time to be simulated and verified before they are fabricated. Also, many other additional drawbacks are described as follows: First, the conventional phase-locked loops 200 and conventional delay-locked loop 400 have suffered from a very long time required to attain lock. Hence, time and power are unnecessarily consumed until the conventional phase-locked loop 200 or the conventional delay-locked loop 400 is in lock. Second, the conventional phase-locked loop 200 has suffered from harmonic locking and the conventional delay-locked loop 400 has suffered from failing to lock. Especially harmonic locking is that the phase-locked loop locks to harmonics of the input signal when a multiplier is used for the phase detector. Third, the conventional switching regulator 100 has suffered from long time to require the output voltage to be regulated. Fourth, simulation time in designing these integrated circuits is absolutely proportional to time required the loops to lock, time to require the output voltage of the switching regulators to be regulated, and number of blocks to be designed and verified. Hence, this long simulation time adds additional cost to the integrated circuit (IC) and serious bottleneck to design time-to-market. Fifth, the conventional locked loops and the conventional switching regulators do not have common analog building block to reduce the number of different blocks that need to be designed and verified. As a result, regularity and productivity can not be achieved. Sixth, the conventional fast-locking phase-locked loop 300 and conventional fast-locking delay-locked loop 500 might improve the lock-in time, but definitely results in uncontrollable lock-in time, bad productivity, higher cost, larger chip area, much more power consumption, and longer design time. Seventh, since lock-in time of phase-locked loops and delay-locked loops and start-up time of switching regulator take different time due to uncontrollable idle time, power and time of most systems are unnecessarily consumed until all systems are in lock or come into regulation and thus power-management of most systems can not be performed.

Thus, what is finally needed is a cost-effective circuit that can make a fast controllable lock-in time for phase-locked loops and delay-locked loops, make a short controllable start-up time for switching regulators, manage power and time consumption for all systems until loops are in lock or until the output voltage of switching regulators comes into regulation, reduce significantly design time for better time-to-market, and improve productivity by reusing the same cost-effective circuit design for the systems such as switching regulators, phase-locked loops, and delay-locked loops to be implemented in system-on chip (SOC), integrated circuit, monolithic circuits, and discrete circuit. The present invention satisfies these needs by providing four embodiments.

SUMMARY OF THE INVENTION

The present invention provides four types of the controllable idle time current mirror circuits. The controllable idle time current mirror circuits simultaneously enable three systems to be high efficient controllable idle time systems such as controllable idle time switching regulators, controllable idle time phase-locked loops, and controllable idle time delay-locked loops. The basic architecture of the controllable idle time current mirror circuits consists of a sensing gate, the Wilson current mirror (or a cascode current mirror), triggering transistors, current source, a n-bit control circuit, and a feedback line. The sensing gate senses a voltage at its input. If the sensing voltage does not reach the expected voltage compared to the midpoint voltage of the sensing gate, the triggering transistors provide a current to its output through the Wilson current mirror (or a cascode current mirror) until the voltage at feedback reaches the midpoint voltage. Time to reach the midpoint voltage at the filter or load is simply equal to the charge stored at the filter or load divided by the total current, which is controllable. Consequently, all controllable idle time current mirror circuits provide a controllable reduction in the difference between the initial condition and the expected condition in order to solve many drawbacks simultaneously. The controllability of idle time enables all systems to be managed in terms of power, stand-by time, and idle time. In addition, the present invention has four different embodiments with an improvement in productivity, performance, cost, chip area, power consumption, efficiency, and design time.

BRIEF DESCRIPTION OF THE DRAWINGS

The accompanying drawings, which are incorporated in and form a part of this specification, illustrate four embodiments of the invention and, together with the description, serve to explain the principles of the invention.

Prior Art

Prior Art

Prior Art

Prior Art

Prior Art

DESCRIPTION OF THE PREFERRED EMBODIMENTS

In the following detailed description of the present invention, four types of the controllable idle time current mirror circuits, numerous specific details are set forth in order to provide a through understanding of the present invention. However, it will be obvious to one skilled in the art that the present invention may be practiced without these specific details. In other instances, well known methods, procedures, CMOS digital gates, components, and metal-oxide-semiconductor field-effect transistor (MOSFET) device physics have not been described in detail so as not to unnecessarily obscure aspects of the present invention.

Figure 1:
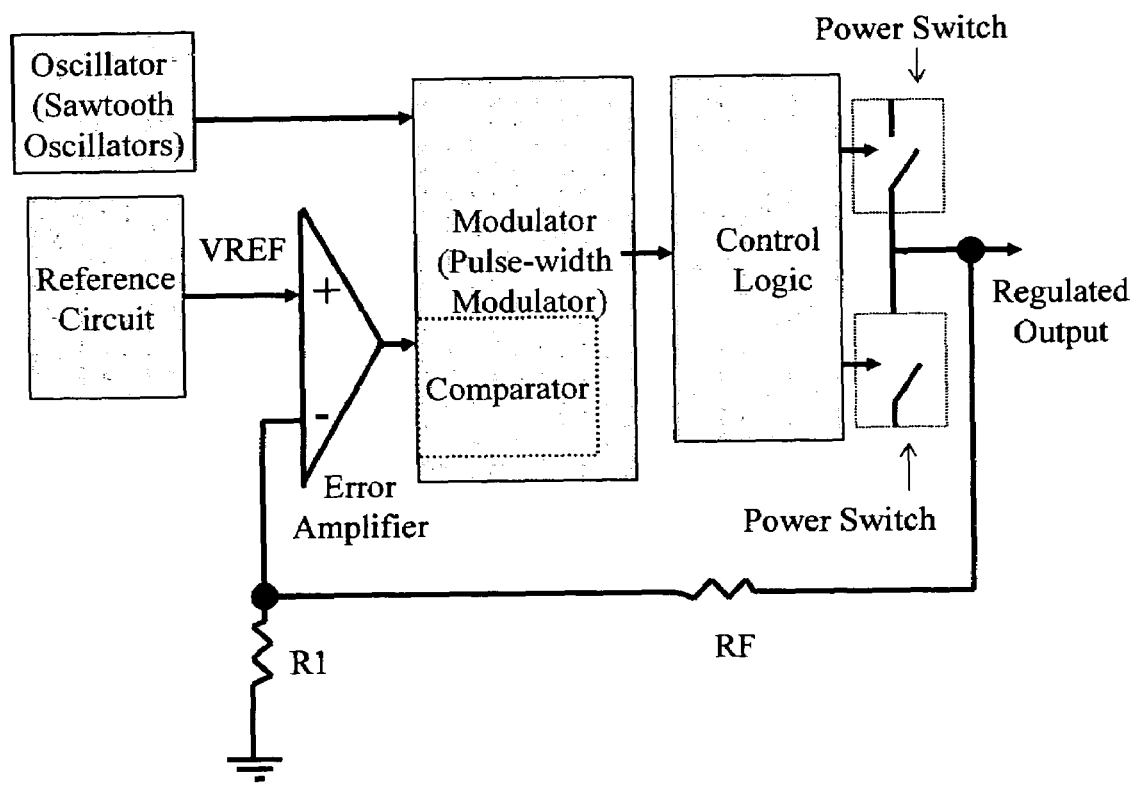
FIG. 1 illustrates a circuit diagram of a conventional switching regulator (i.e., DC-TO-DC converter).
Figure 2:
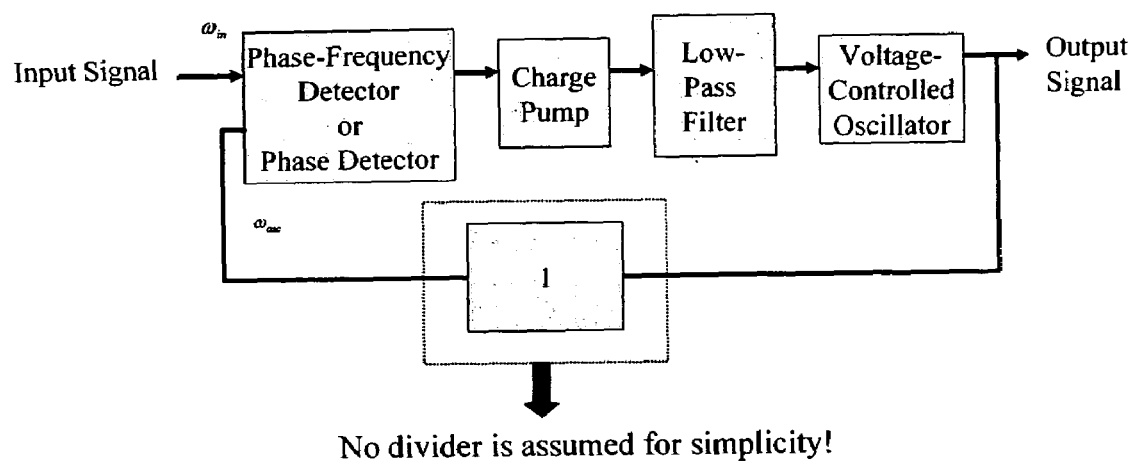
FIG. 2 illustrates a circuit diagram of a conventional phase-locked loop.
Figure 3:
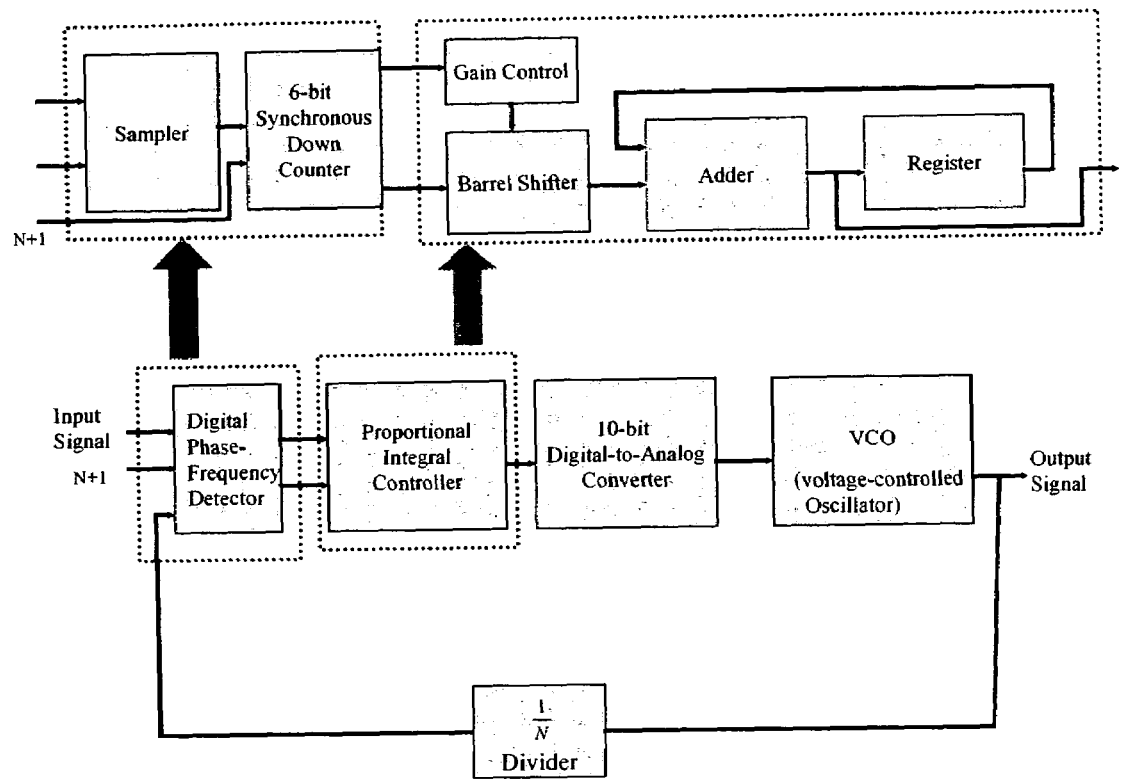
FIG. 3 illustrates a circuit diagram of a conventional fast-locking phase-locked loop.
Figure 4:
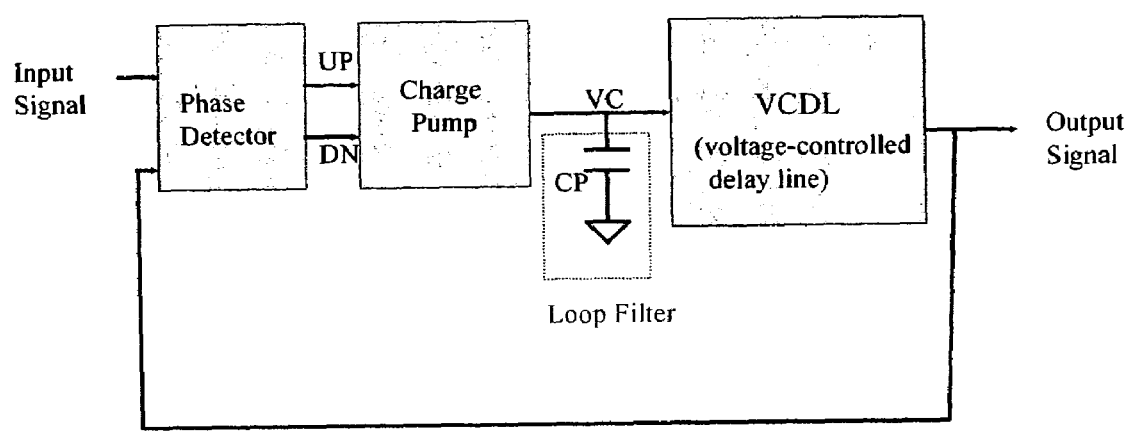
FIG. 4 illustrates a circuit diagram of a conventional delay-locked loop.
Figure 5:
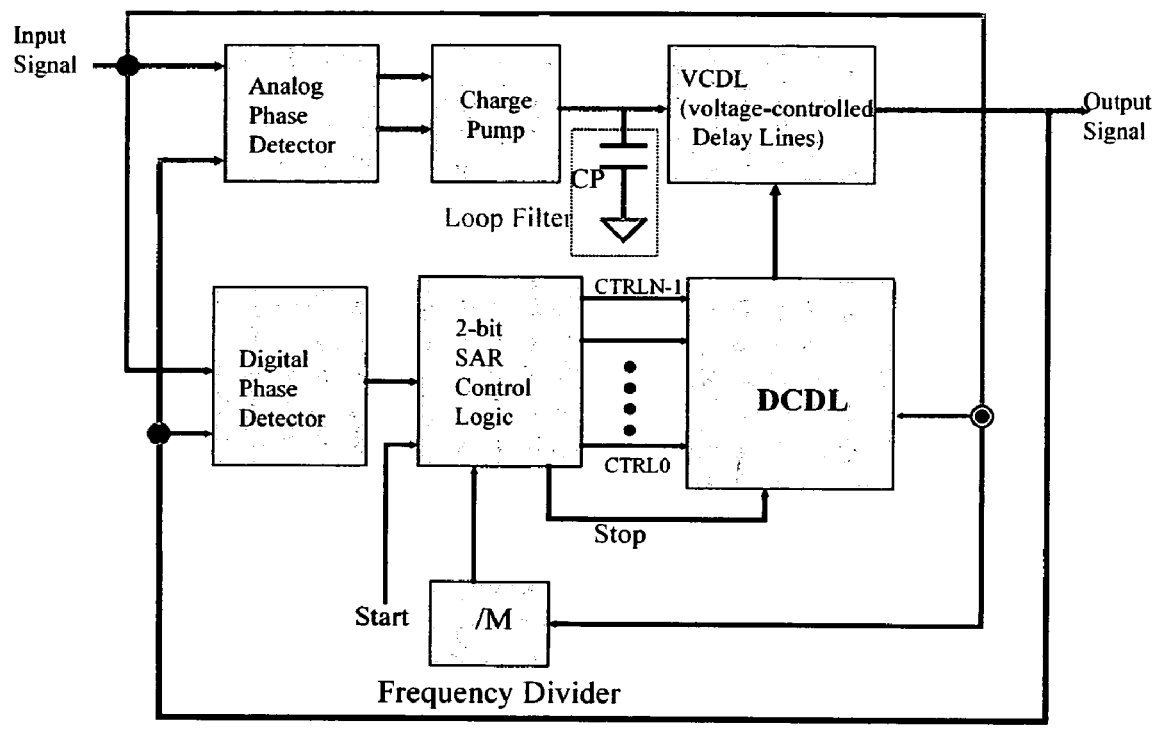
FIG. 5 illustrates a circuit diagram of a conventional fast-locking delay-locked loop.
Figure 6:
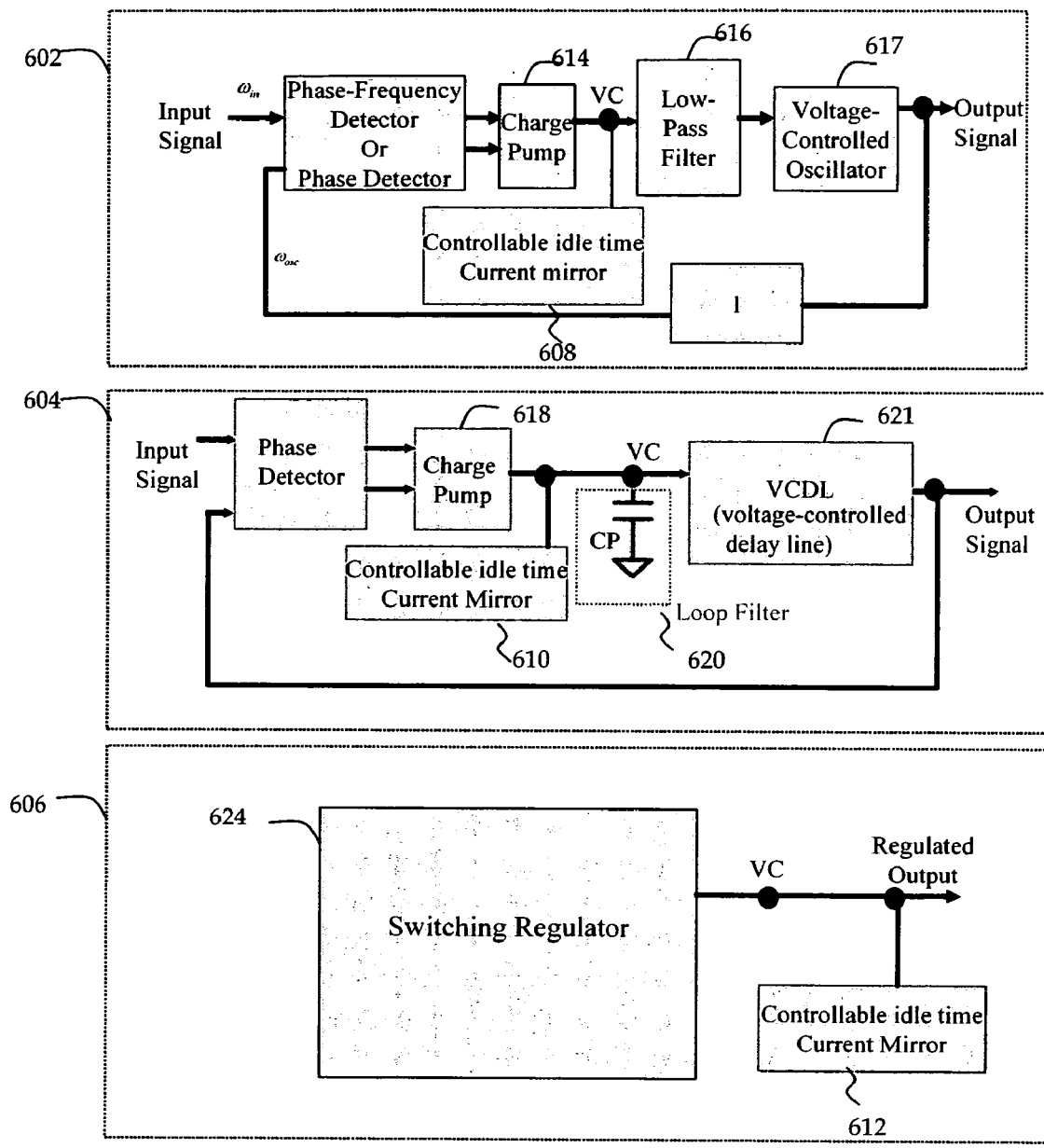
FIG. 6 illustrates a diagram of three systems using a controllable idle time current mirror circuit in accordance with the present invention.

FIG. 6 illustrates three systems using the same controllable idle time current mirror circuit in accordance with the present invention. It is noted that the controllable idle time current mirror blocks 608, 610, 612 are the same one used for three systems 602, 604, and 606 such as controllable idle time phase-locked loop 602, controllable idle time delay-locked loop 604, and controllable idle time switching regulator 606. The controllable idle time current mirror circuits 700, 800, 900, and 1000 of the present invention basically enables three conventional systems to be cost-effective controllable idle time systems with an improvement in productivity, cost, chip area, power consumption, and design time.

First, to reduce the controllable initial difference between input signal's frequency and the voltage-controlled oscillator's frequency by affecting the voltage-controlled oscillator 617 initially, the output of the controllable idle time current mirror circuit 608 is coupled to the node connected to a charge-pump 614 and a low-pass filter 616, as seen in the phase-locked loop 602 shown in FIG. 6. Second, to reduce the controllable initial difference between input signal's frequency and voltage-controlled delay line's frequency by affecting the voltage-controlled delay line initially, the output of the controllable idle time current mirror circuit 610 is coupled to the node connected to a charge-pump 618 and a loop filter 620, as seen in the delay-locked loop 604 shown in FIG. 6. Third, to reduce the controllable difference between the initial output voltage and the expected output voltage of the switching regulator, the output of the controllable idle time current mirror circuit 612 is coupled to the output of a switching regulator 624, as shown in FIG. 6. The switching regulator 624 represents all types of switching regulators (i.e., DC-TO-DC converter) without regard to the architecture of switching regulators because the applications of the controllable idle time current mirror circuit 612 is independent of architecture or types of switching regulators.

Filters are well known circuits in the art and can be implemented using two configurations: a filter connected to ground and $V_C$ and a filter connected to a power supply voltage (e.g., $V_{DD}$, "1", high, etc.) and $V_C$. In addition, voltage-controlled oscillators (or voltage-controlled delay lines) are well known circuits in the art and can be implemented using two configurations: one whose frequency increases proportionally to $V_C$ and the other whose frequency decreases proportionally to $V_C$.

Figure 7:
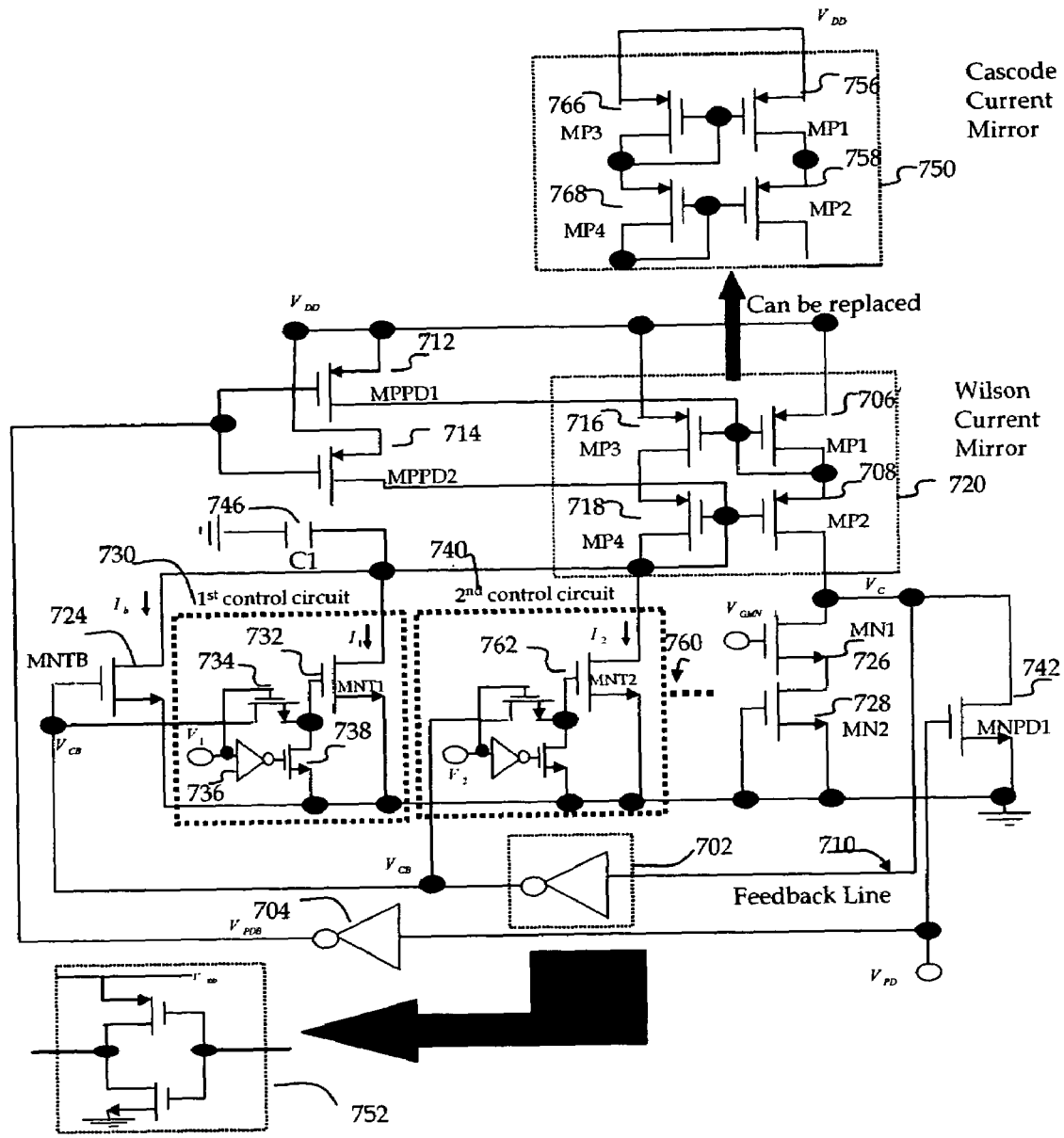
FIG. 7 illustrates a circuit diagram of a controllable idle time current mirror circuit according to the present invention.

FIG. 7 illustrates a circuit diagram of a controllable idle time current mirror circuit 700 according to the present invention. This controllable idle time current mirror circuit 700 is one of four power-down enable embodiments of the invention. A power-down input voltage, $V_{PD}$, is defines as the input voltage for power down mode. The power-down enable system is in power down mode when $V_{PD}$ is $V_{DD}$ and it is in normal mode when $V_{PD}$ is zero. In practice, the controllable idle time current mirror circuit 700 is a feedback circuit that consists of a sensing inverter 702 (i.e., an odd numbers of inverters), a base triggering NMOS transistor 724, the Wilson current mirror 720 (or a cascode current mirror 750), NMOS transistor current source 726 and 728, two control circuits 730 and 740 including triggering NMOS transistors 732 and 762, a capacitor 746, and a feedback line 710 with following power-down transistors: a power-down inverter 704, two power-down PMOS transistors 712 and 714, and a power-down NMOS transistor 742. Two control circuits 730 and 740 are shown in FIG. 7 while the dotted line 760 represents (i–2) control circuits (not shown), where i is an integer ranging between 2 and n. So, there are totally n control circuits. The current-scaling binary-weighted control circuit array generates a bias current provided to the output through the Wilson current mirror by scaling the device aspect ratio of each triggering NMOS transistor in the control circuit array. $I_1$ through $I_n$ would be controlled by the binary bit coefficients associated with an N-bit digital input signal. Hence, the total current, $I_{TOTAL}$, corresponding to an N-bit digital input is given as follows:

$$I_{TOTAL} = I_b + (b_1 I_1) + (b_2 I_2) + (b_3 I_3) \ldots + (b_n I_n)$$

where $b_1, b_2, \ldots, b_n$ are the binary bit coefficients having a value of either a "1" or "0". The binary coefficient $b_1$ represents the most significant bit while $b_n$ represents the least significant bit. The binary bit coefficients are set by the control input voltages in FIG. 7. $I_1$ is the largest current in the binary-weighted array, corresponding to the MSB (i.e., the most significant bit) input while $I_n$ is the smallest current in the binary-weighted array, corresponding to the LSB (i.e., the least significant bit) input. As seen in the first control circuit 730 shown in FIG. 7, a triggering NMOS transistor 732 shares the drain terminal with the base triggering NMOS transistor 724 so that currents are added. Two NMOS (or CMOS) switches 734 and 738 are coupled to the gate terminal of the triggering NMOS transistor 732 in order to turn off the triggering NMOS transistor 732 completely. In particular, the gate of the NMOS (or CMOS) switch 738 is controlled by the inverting control input, $\overline{V}_1$, through an inverter 736 while the gate of the NMOS (or CMOS) switch 734 is controlled by the non-inverting control input, $V_1$. For example, if $V_1$ is power supply voltage (e.g., $V_{DD}$, "1", high, etc.), the NMOS switch (or CMOS switch) 738 is off and the NMOS switch (or CMOS switch) 734 is on. As s result, the triggering NMOS transistor 732 in the first control circuit is in cutoff and thus the triggering NMOS transistor 732 does not provide any current to the output. In addition, the capacitor 746 is added to the drain of the triggering NMOS transistors to attenuate glitches since it provides additional paths to ground. Likewise, more additional capacitors can be added to necessary nodes in FIG. 7 to attenuate glitches.

For simplicity, it is assumed that controllable idle time current mirror circuit 700 has only 2-bit control circuits. In addition, if $V_1$ and $V_2$ of control circuits 730 and 740 are $V_{DD}$ with $V_{CB} = V_{DD}$ to turn on the triggering NMOS transistors 732 and 762. The sensing inverter 702 senses a voltage at its input when the circuit mode changes from power-down mode to normal mode after its start-up. Since the sensing inverter 702 initially senses the input voltage less than the midpoint voltage of the sensing inverter, the output voltage of the sensing inverter 702 is high enough to turn on the triggering NMOS transistors 724, 732, and 762. Thus, these three triggering NMOS transistors provide a total current to the output through the Wilson current mirror 720 until the output voltage, $V_C$, goes up to the midpoint voltage, which is decided by the device aspect ratios of the sensing inverter. Time to reach the midpoint voltage at the filter of load is simply equal to the charge stored at the filter of load divided by the total current. If the filter or load is multiple-order circuit, it will be approximated to the first-order filter 620 shown in FIG. 6. At the same time, all resistors in the filter (or load) are assumed to be neglected for simplicity. Thus, time to reach the midpoint voltage, corresponding to an N-bit digital input is as follows:

$$\Delta t = \frac{V_M C_P}{I_b + (b_1 I_1) + (b_2 I_2) + (b_3 I_3) \ldots + (b_n I_n)}$$

where $V_M$ is the midpoint voltage determined by the device aspect ratios of the sensing inverter 702 and $C_P$ is the value of the capacitor in the filter or load. Thus, the controllable idle time for phase-locked loops and delay-locked loops is approximately given by $$\frac{(\omega_{in} - \omega_M)^2}{\omega_0^3} + \frac{V_M C_P}{I_b + (b_1 I_1) + (b_2 I_2) + (b_3 I_3) \ldots + (b_n I_n)}$$

where $\omega_{in}$ is the input signal frequency, $\omega_M$ is the voltage-controlled oscillator's frequency for $V_C = V_M$, and $\omega_0$ is the loop bandwidth. Also, assuming that $V_M$ is the output voltage of the switching regulators closer to the regulated output voltage, the controllable idle time for switching regulators is approximately given by $$\frac{V_M C_P}{I_b + (b_1 I_1) + (b_2 I_2) + (b_3 I_3) \ldots + (b_n I_n)}$$

The midpoint voltage is a voltage where the input voltage and the output voltage of the inverter are equal in the voltage transfer characteristic. At the midpoint voltage, the transistors of the inverter operate in the saturation mode. This midpoint voltage of inverter is expressed as $$\frac{V_{DD} - V_{T_n} - |V_{T_p}|}{1 + \sqrt{\frac{K_n}{K_p}}} + V_{T_n} \text{ where } \frac{K_n}{K_p} = \frac{\mu_n C_{OX} \left(\frac{W}{L}\right)_n}{\mu_p C_{OX} \left(\frac{W}{L}\right)_p}$$

In addition, in the NMOS transistor current source, the gate terminal of a NMOS transistor 728 is shorted and the gate of a NMOS transistor 726 is connected to a proper fixed-bias voltage (not shown) or a power supply voltage (e.g., $V_{DD}$, "1", high, etc.). Thus, all triggering NMOS transistors finally provide the current, $I_{TOTAL}$, to the output so that $V_C$ goes up to the midpoint voltage, $V_M$. So, the total current, $I_{TOTAL}$, from the drains of the PMOS transistors 706 and 708 flows into a load while no current flows into the drains of the NMOS transistors 726 and 728.

In two current mirrors 720 and 750 shown in FIG. 7, gate terminals of transistors MP1 706 and MP3 716 are coupled each other and gate terminals of transistors MP2 708 and MP4 718 are coupled each other. Especially in the Wilson current mirror 720, the transistors MP1 706 and MP4 718 are diode-connected transistors. Those skilled in the art will recognize that with minor modifications, the diode-connected scheme may be modified with the transistors MP3 766 and MP4 768 serving as diode-connected transistors shown in the cascode current mirror 750 of FIG. 7.

In practical applications of the controllable idle time current mirror circuit of FIG. 7, it is also desirable to use a value for the midpoint voltage, $V_M$, less than the voltage that makes the voltage-controlled oscillator's frequency (or the voltage-controlled delay line's frequency) equal to the input signal's frequency in the configuration where the voltage-controlled oscillator's frequency increases proportionally to $V_C$ formed from a filter connected to ground and $V_C$. The CMOS process variations usually must be considered so that the proper value of the midpoint voltage is chosen for the controllable idle time current mirror circuit of FIG. 7. In addition, each bulk of four PMOS transistors in the current mirrors 720 and 750 can be connected to its own N-well to obtain better immunity from substrate noise.

To understand power down mode, the following case will be considered. Since the power-down input voltage, $V_{PD}$, becomes $V_{DD}$ for power-down mode, the output voltage, $V_{PDB}$, of the power-down inverter 704 is zero. The power-down NMOS transistor 742 is on during power-down mode and thus provides an output pull-down path to ground. Thus, $V_C$ of the controllable idle time current mirror circuit 700 is zero during power-down mode. Zero dc volt at $V_C$ ensures that no current flows into the circuits during power-down mode. During power-down mode, the voltage-controlled oscillator (or the voltage-controlled delay line's frequency) has a free-running frequency or does not oscillate for $V_C=0$. At this point, to realize this power-down mode, one should use the voltage-controlled oscillator (or the voltage-controlled delay line) whose frequency increases proportionally to $V_C$ formed from a filter connected to ground and $V_C$.

In practice, the controllable idle time current mirror circuit of the present invention 700 is used within the systems 602, 604, and 606. Assuming that three systems 602, 604, and 606, shown in FIG. 6, have the same power-down mode as the circuit 700 does, the phase-locked loop 602 including the circuit 700 used for the block 608 can be simply termed the controllable idle time phase-locked loop. Likewise, the delay-locked loop 604 and the switching regulator 606 can be simply called the controllable idle time delay-locked loop and the controllable idle time switching regulator, respectively. The controllable idle time current mirror circuit 700 within the systems 602, 604, and 606 exhibits three desirable features as follows: 1. How fast the phase-locked loop becomes locked is controlled by an N-bit digital input and a device aspect ratio of each triggering NMOS transistor for a given filter. 2. How fast the delay-locked loop becomes locked is controlled by an N-bit digital input and a device aspect ratio of each triggering NMOS transistor for a given filter. 3. How fast the switching regulator comes in regulations is controlled by an N-bit digital input and a device aspect ratio of each triggering NMOS transistor for a given output load.

The systems including the controllable idle time current mirror circuit 700 have the following advantages: a fast controllable lock-in time for phase-locked loops and delay-locked loops, a solution for harmonic locking problem of phase-locked loops, a prevention of delay-locked loops from failing to lock, a short controllable start-up time of switching regulators, a controllable reduction in power and time consumption until lock or regulation, a significant reduction in design time for better time-to-market, a higher performance, power sequence control for reliable systems, and an improvement in productivity by reusing the same cost-effective circuit for three controllable idle time systems such as controllable idle time phase-locked loop 602, controllable idle time delay-locked loop 604, and controllable idle time switching regulator 606. The present invention offers the above advantages by simply providing a controllable idle time current mirror circuit 700.

It is noted that SPICE is used for the simulation of phase-locked loops. The conventional phase-locked loop 200 and the controllable idle time phase-locked loop 602 are simulated using the same blocks except the controllable idle time current mirror circuit 700. As a result, the total simulation time of the conventional phase-locked loop 200 is 20 hours. However, the total simulation time of the controllable idle time phase-locked loop 602 varies from 2 hours to 6 hours. For a given filter, this total simulation time mainly depends on an N-bit digital input and a device aspect ratio of each triggering NMOS transistor. This controllable improvement can be accomplished by simply inserting a controllable idle time current mirror circuit 700 into a conventional phase-locked loop 200, and the simulation time can be reduced by a factor of 10. Likewise, for delay-locked loops and switching regulators, the simulation time can be reduced by a factor of 10.

Figure 8:
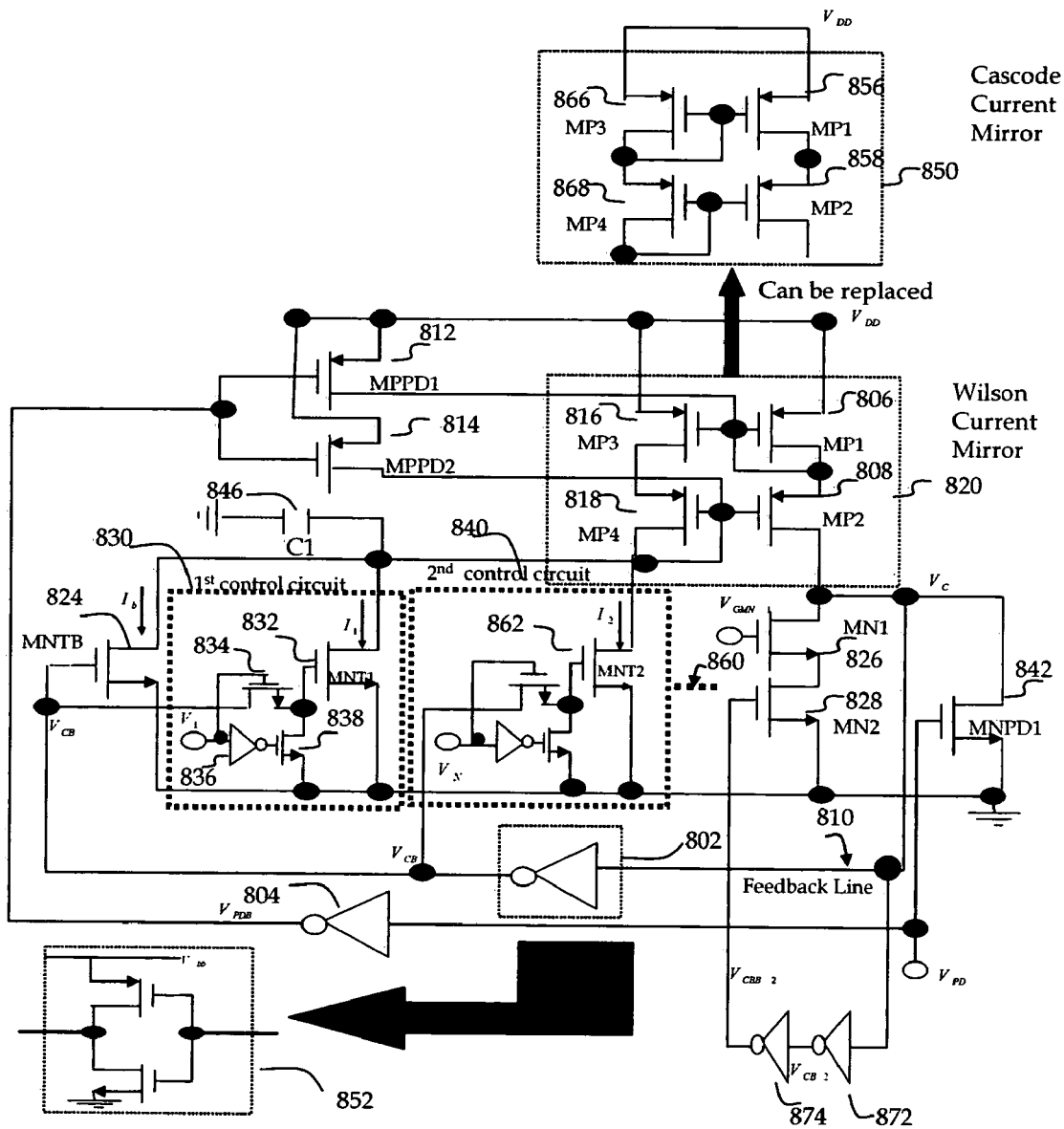
FIG. 8 illustrates a precisely controllable idle time current mirror circuit with the present invention.

FIG. 8 illustrates a circuit diagram of a precisely controllable idle time current mirror circuit 800 in accordance with the present invention. The precisely controllable idle time current mirror circuit 800 is one of four power-down enable embodiments of the invention. In practice, the precisely controllable idle time current mirror circuit 800 is a feedback circuit that consists of a lower-voltage sensing inverter 802 (i.e., an odd numbers of inverters), an higher-voltage sensing inverter 872 (i.e., an odd numbers of inverters), a second inverter 874, a base triggering NMOS transistor 824, the Wilson current mirror 820 (or a cascode current mirror 850), NMOS transistor current source 826 and 828, a capacitor 846, two control circuits 830 and 840, and a feedback line 810 with following power-down transistors: a power-down inverter 804, two power-down PMOS transistors 812 and 814, and a power-down NMOS transistor 842. Two control circuits 830 and 840 are shown in FIG. 8 while the dotted line 860 represents (i−2) control circuits (not shown), where i is an integer ranging between 2 and n. So, there are totally n control circuits. The current-scaling binary-weighted control circuit array generates a bias current provided to the output through the Wilson current mirror 820 by scaling the device aspect ratio of each triggering NMOS transistor in the control circuit array. $I_1$ through $I_n$ would be controlled by the binary bit coefficients associated with an N-bit digital input signal. Hence, the precisely controllable idle time current mirror circuit 800 provides the same total current as FIG. 7 does. The previous principle and operation are applied to the control circuits 830 and 840 shown in FIG. 8. In addition, the capacitor 846 is added to the drain of the triggering NMOS transistors to attenuate glitches since it provides additional paths to ground. Likewise, more additional capacitors can be added to necessary nodes shown in FIG. 8 to attenuate glitches.

For simplicity, it is again assumed that the precisely controllable idle time current mirror circuit 800 has only 2-bit control circuits. In addition, if $V_1$ and $V_2$ of control circuits 830 and 840 are $V_{DD}$ with $V_{CB}=V_{DD}$ to turn on the triggering NMOS transistors 832 and 862. The sensing inverter 802 senses a voltage at its input when the circuit mode changes from power-down mode to normal mode after its start-up. Since the sensing inverter 802 initially senses the input voltage less than the midpoint voltage of the sensing inverter, the output voltage of the sensing inverter 802 is high enough to turn on the triggering NMOS transistors 824, 832, and 862. Thus, these three triggering NMOS transistors provide a total current to the output through the Wilson current mirror 820 until the output voltage, $V_C$, goes up to the midpoint voltage, which is decided by the device aspect ratios of the sensing inverter 802. Thus, the triggering NMOS transistors finally provide a current, $I_{TOTAL}$, to the output so that $V_C$ goes up to the midpoint voltage, $V_M$. So, the total current, $I_{TOTAL}$, from the drains of the PMOS transistors 806 and 808 flows into a load until the output voltage, $V_C$, goes up to the midpoint voltage. At the same time, no current flows into the drains of the NMOS transistors 826 and 828 assuming $V_C < V_{M(H)}$ where $V_{M(H)}$ is the higher midpoint voltage of the higher-voltage sensing inverter 872 for precision control. If $V_C$ is greater than $V_{M(H)}$, the input voltage of the higher-voltage sensing inverter 872 is low and thus the output voltage of the second inverter 874 is $V_{DD}$. Thus, the NMOS transistor 828 is on and thus current flows into the drains of the NMOS transistors 826 and 828 until $V_C$ goes down to $V_{M(H)}$. Also, $V_M$ is the midpoint voltage decided by the device aspect ratios of the lower-voltage sensing inverter 802. On contrary, $V_{M(H)}$ is the higher midpoint voltage decided by the device aspect ratios of the higher-voltage sensing inverter 872. In addition, it is noted that the gate terminal of a NMOS transistor 828 is not shorted and the gate of a NMOS transistor 826 is connected to a proper fixed-bias voltage (not shown) or a power supply voltage (e.g., $V_{DD}$, "1", high, etc.).

Also, in two current mirrors 820 and 850 shown in FIG. 8, gates of transistors MP1 806 and MP3 816 are coupled each other and gates of transistors MP2 808 and MF4 818 are coupled each other. Especially in the Wilson current mirror 820, the transistors MP1 806 and MP4 818 are diode-connected transistors. Those skilled in the art will recognize that with minor modifications, the diode-connected scheme may be modified with the transistors MP3 866 and MP4 868 serving as diode-connected transistors shown in the cascode current mirror 850 of FIG. 8.

In the practical applications of the precisely controllable idle time current mirror circuit of FIG. 8, it is also desirable to use a value for the midpoint voltage, $V_M$, less than $V'_C$ and a value for the higher midpoint voltage, $V_{M(H)}$, greater than $V'_C$. $V'_C$ is $V_C$ that makes the voltage-controlled oscillator's frequency (or the voltage-controlled delay line's frequency) equal to the input signal's frequency in the configuration where the voltage-controlled oscillator's frequency increases proportionally to $V_C$ formed from a filter connected to ground and $V_C$. The CMOS process variations usually must be considered so that the proper value of the midpoint voltage is chosen for the precisely controllable idle time current mirror circuit of FIG. 8. In addition, each bulk of four PMOS transistors in the current mirrors 820 and 850 can be connected to its own N-well to obtain better immunity from substrate noise.

The operation and principles of power down mode shown in FIG. 8 are the same as those of the circuit shown in FIG. 7. To realize this power-down mode, one should use the voltage-controlled oscillator (or the voltage-controlled delay line) whose frequency increases proportionally to $V_C$ formed from a filter connected to ground and $V_C$.

In practice, the precisely controllable idle time current mirror circuit of the present invention 800 is used within the systems 602, 604, and 606. Assuming that three systems 602, 604, and 606, shown in FIG. 6, have the same power-down mode as the circuit 800 does, the phase-locked loop 602 including the precisely controllable idle time current mirror circuit 800 used for the block 608 can be simply termed the controllable idle time phase-locked loop. Likewise, the delay-locked loop 604 and the switching regulator 606 can be simply called the controllable idle time delay-locked loop and the controllable idle time switching regulator, respectively.

The precisely controllable idle time current mirror circuit 800 within the systems 602, 604, and 606 exhibits the same desirable features as the controllable idle time current mirror circuit 700 within the systems 602, 604, and 606 exhibits. The systems 602, 604, and 606 including the circuit 800 have the same advantages as the systems 602, 604, and 606 including the circuit 700 have. To avoid redundancy, the statement of three desirable features and the advantages is omitted here, too. The present invention offers the above advantages by simply providing a precisely controllable idle time current mirror circuit adding two more inverters and connecting the gate of NMOS transistor 828 to the output of the second inverter 874. Like the case for FIG. 7, the simulation time of each system using the precisely controllable idle time current mirror 800 can be reduced by a factor of 10.

Figure 9:
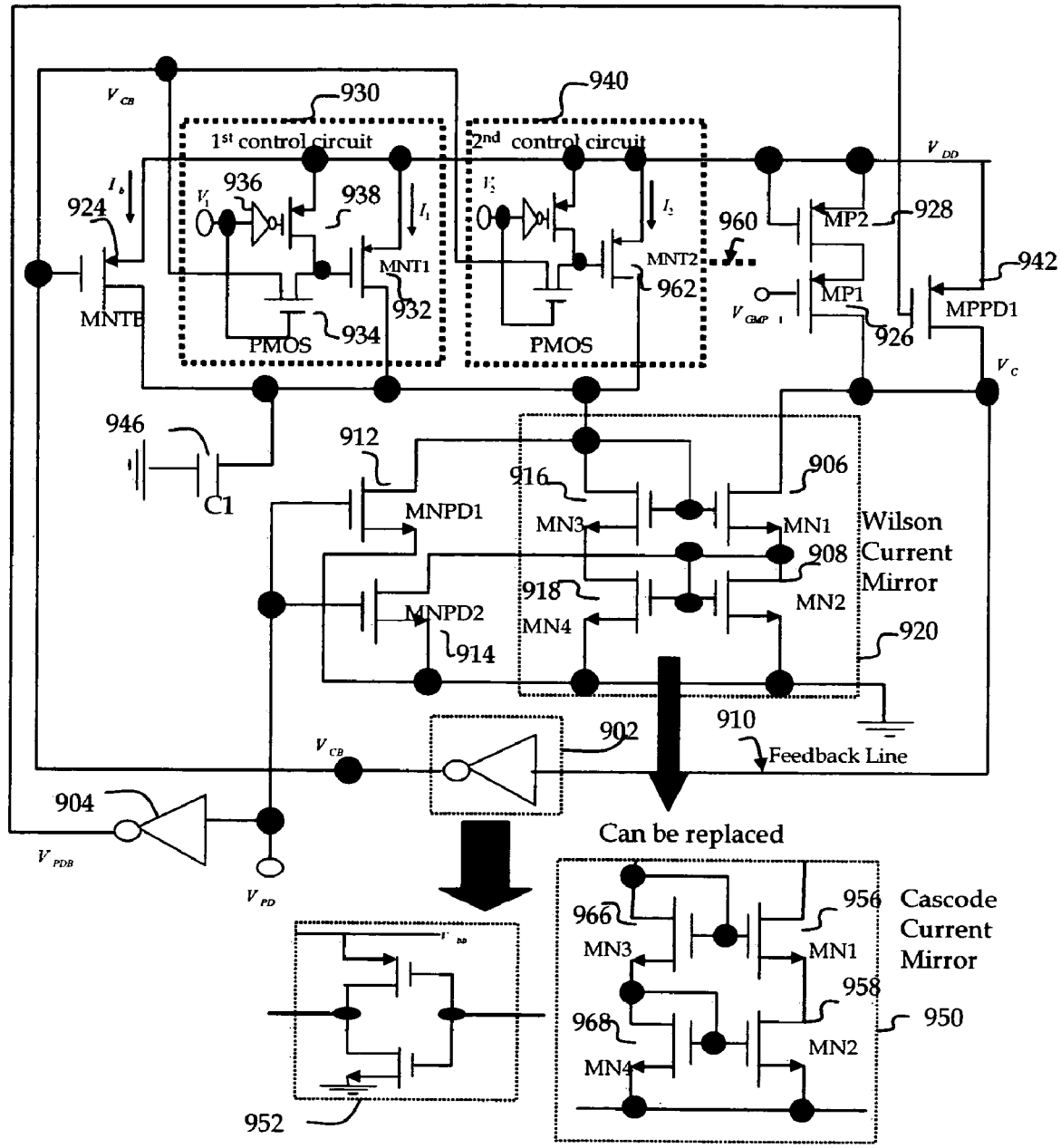
FIG. 9 illustrates a circuit diagram of a p-type controllable idle time current mirror circuit according to the present invention.

FIG. 9 illustrates a circuit diagram of a p-type controllable idle time current mirror circuit 900 according to the present invention. The p-type controllable idle time current mirror circuit 900 is one of four power-down enable embodiments of the invention. The p-type power-down mode is simply termed p-type. The power-down input voltage, $V_{PD}$, is defines as the input voltage for the p-type power down mode as well as for the power down mode. In addition, p-type power down mode can also be termed the power-down mode, too. The p-type power-down enable system is in power down mode when $V_{PD}$ is $V_{DD}$ and it is in normal mode when $V_{PD}$ is zero.

In practice, the p-type controllable idle time current mirror circuit 900 is a feedback circuit that consists of a higher-voltage sensing inverter 902 (i.e., an odd numbers of inverters), a base triggering PMOS transistor 924, the Wilson current mirror 920 (or a cascode current mirror 950), PMOS transistor current source 928 and 926, a capacitor 946, two control circuits 930 and 940, and a feedback line 910 with following power-down transistors: a power-down inverter 904, two power-down NMOS transistors 912 and 914, and a power-down PMOS transistor 942. Two control circuits 930 and 940 are shown in FIG. 9 while the dotted line 960 represents (i-2) control circuits (not shown), where i is an integer ranging between 2 and n. So, there are totally n control circuits. The current-scaling binary-weighted control circuit array generates a bias current provided to the output through the Wilson current mirror 920 by scaling the device aspect ratio of each triggering PMOS transistor in the control circuit array. $I_1$ through $I_n$ would be controlled by the binary bit coefficients associated with an N-bit digital input signal. Hence, the p-type controllable idle time current mirror circuit 900 provides the same total current as FIG. 7 and FIG. 8 do. The previous principle and operation of the control circuits 830 and 840 shown in FIG. 8 are applied to the control circuits 930 and 940 shown in FIG. 9. In addition, the capacitor 946 is added to the drain of the triggering PMOS transistors to attenuate glitches since it provides additional paths to ground. Likewise, more additional capacitors can be added to necessary nodes shown in FIG. 9 to attenuate glitches.

For simplicity, it is again assumed that the p-type controllable idle time current mirror circuit 900 has only 2-bit control circuits. In addition, if $V_1$ and $V_2$ of control circuits 930 and 940 are zero with $V_{CB}$=0, the triggering PMOS transistors 932 and 962 are turned on. The sensing inverter 902 senses a voltage at its input when the circuit mode changes from power-down mode to normal mode after its start-up. Since the higher-voltage sensing inverter 902 initially senses $V_{DD}$, which is greater than the higher midpoint voltage, $V_{M(H)}$, of the higher-voltage sensing inverter, the output voltage of the higher-voltage sensing inverter 902 is low enough to turn on the triggering PMOS transistors 924, 932, and 962. Thus, these three triggering PMOS transistors provide a total current to the output through the Wilson current mirror 920 until the output voltage, $V_C$, goes down to the higher midpoint voltage, $V_{M(H)}$, which is decided by the device aspect ratios of the higher-voltage sensing inverter 902. Thus, the triggering PMOS transistors finally provide a current, $I_{TOTAL}$, to the output so that $V_C$ goes down to the higher midpoint voltage, $V_{M(H)}$. So, the total current, $I_{TOTAL}$, flows out of the load and into the drains of the NMOS transistors 906 and 908. In addition, it is noted that the gate terminal of a PMOS transistor 928 is connected to a power supply voltage (e.g., $V_{DD}$, "1", high, etc.) and the gate of a PMOS transistor 926 is connected to a proper fixed-bias voltage (not shown) or a power supply voltage. Since the PMOS transistor 928 is turned off, no current flows into the drains of the PMOS transistors 926 and 928. Also, $V_{M(H)}$ is the higher midpoint voltage decided by the device aspect ratios of the higher-voltage sensing inverter 902. Also, in two current mirrors 920 and 950 shown in FIG. 9, gates of transistors MN1 906 and MN3 916 are coupled each other and gates of transistors MN2 908 and MN4 918 are coupled each other. Especially in the Wilson current mirror 920, the transistors MN3 916 and MN2 908 are diode-connected transistors. Those skilled in the art will recognize that with minor modifications, the diode-connected scheme may be modified with the transistors MN3 966 and MN4 968 serving as diode-connected transistors shown in the cascode current mirror 950 of FIG. 9.

In the practical applications of the p-type controllable idle time current mirror circuit of FIG. 9, it is also desirable to use a value for the higher midpoint voltage, $V_{M(H)}$, greater than $V_C$. $V_C$ is $V_C$ that makes the voltage-controlled oscillator's frequency (or the voltage-controlled delay line's frequency) equal to the input signal's frequency in the configuration where the voltage-controlled oscillator's frequency decreases proportionally to $V_C$ formed from a filter connected to a power supply voltage (e.g., $V_{DD}$, "1", high, etc.) and $V_C$. The CMOS process variations usually must be considered so that the proper value of the midpoint voltage is chosen for the p-type controllable idle time current mirror circuit of FIG. 9. In addition, each bulk of four PMOS transistors in the current mirrors 920 and 950 can be connected to its own N-well to obtain better immunity from substrate noise.

To understand power down mode of the p-type controllable idle time current mirror circuit of FIG. 9, the following case will be considered. If $V_{PD}$ becomes $V_{DD}$ during power-down mode, the output voltage of the power-down inverter, $V_{PDB}$, is zero, which turns on the power-down PMOS transistor 942 during power-down mode and thus provides an output pull-up path to $V_{DD}$. Thus, the $V_C$ of the p-type controllable idle time current mirror circuit circuit 900 is $V_{DD}$. $V_C$=$V_{DD}$ ensures that no current flows into the circuits during power-down mode. At this point, to realize this power-down mode for all building blocks, one should use the voltage-controlled oscillator (or the voltage-controlled delay line) whose frequency decreases proportionally to $V_C$ formed from a filter connected to $V_{DD}$ and $V_C$. In other words, the voltage-controlled oscillator (or the voltage-controlled delay line's frequency) has a free-running frequency or does not oscillate when $V_C$ is $V_{DD}$. For this configuration shown in FIG. 9, $V_C$ must be $V_{DD}$ during power-down mode to ensure that no current flows into the circuits. On the contrary, it was stated earlier that $V_C$ must be zero when power-down mode occurs in FIG. 8.

In practice, the p-type controllable idle time current mirror circuit of the present invention 900 is used within the systems 602, 604, and 606. Assuming that three systems 602, 604, and 606, shown in FIG. 6, have the same p-type power-down mode as the circuit 900 does, the phase-locked loop 602 including the circuit 900 used for the block 608 can be simply termed the controllable idle time phase-locked loop. Likewise, the delay-locked loop 604 and the switching regulator 606 can be simply called the controllable idle time delay-locked loop 604 and the controllable idle time switching regulator 606, respectively.

The p-type controllable idle time current mirror circuit 900 within the systems 602, 604, and 606 exhibits the same desirable features as the two controllable idle time current mirror circuits 700 and 800 within the systems 602, 604, and 606 exhibit. The systems 602, 604, and 606 including the circuit 900 have the same advantages as the systems 602, 604, and 606 including the circuit 700 or the circuit 800 have. To avoid redundancy, the statement of three desirable features and the advantages is omitted here, too. The present invention offers the above advantages by simply providing a p-type controllable idle time current mirror circuit. Like the case for FIG. 7 and FIG. 8, the simulation time of each controllable idle time system using the p-type controllable idle time current mirror of FIG. 9 can be reduced by a factor of 10.

Figure 10:
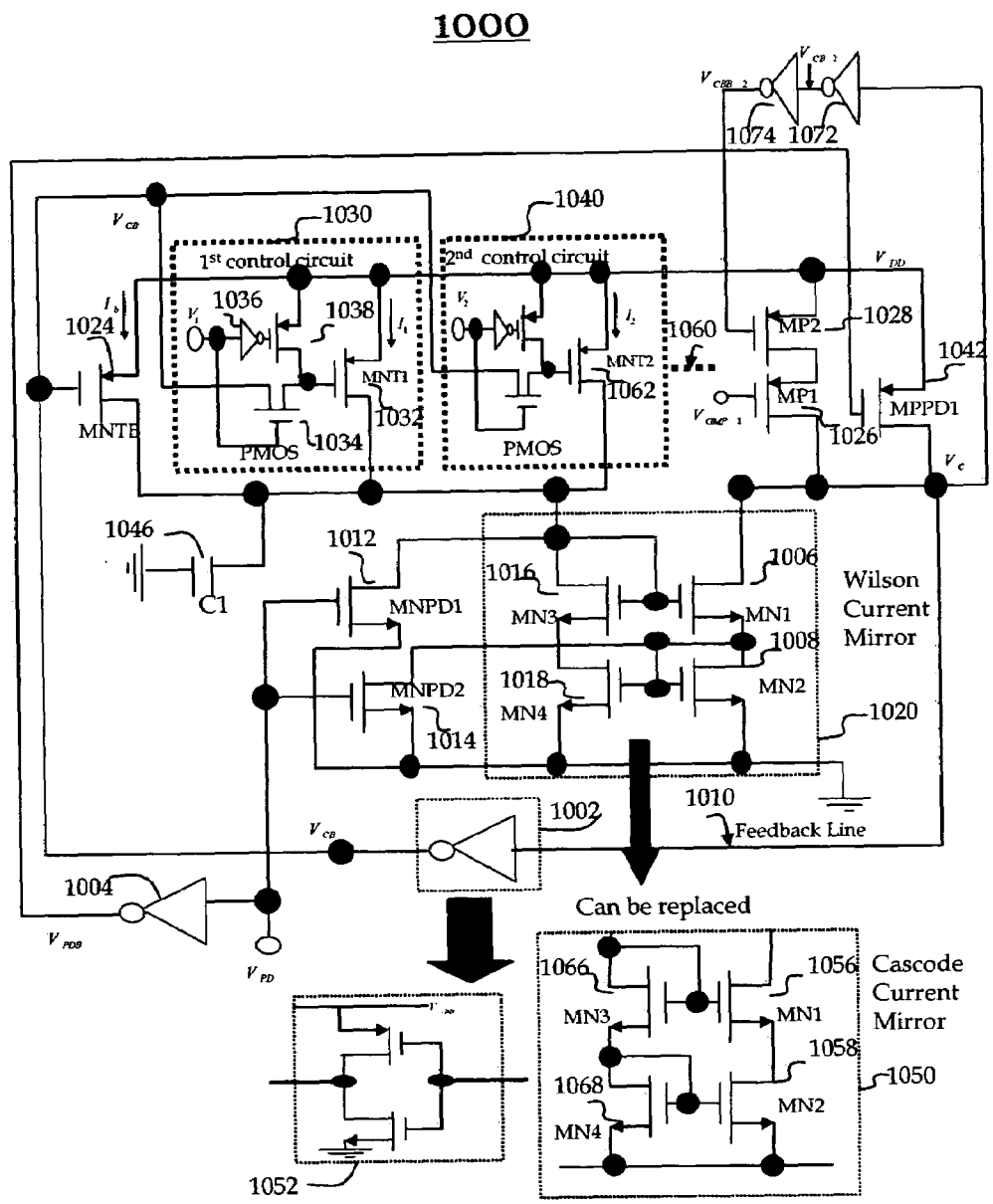
FIG. 10 illustrates a circuit diagram of a p-type precisely controllable idle time current mirror circuit in accordance with the present invention.

FIG. 10 illustrates a circuit diagram of a p-type precisely controllable idle time current mirror circuit 1000 in accordance with the present invention. The p-type precisely controllable idle time current mirror circuit 1000 is one of four power-down enable embodiments of the invention. The p-type power-down mode discussed in FIG. 9 is again applied to FIG. 10. In practice, the p-type precisely controllable idle time current mirror circuit 1000 is a feedback circuit that consists of a higher-voltage sensing inverter 1002 (i.e., an odd numbers of inverters), a lower-voltage sensing inverter 1072 (i.e., an odd numbers of inverters), a second inverter 1074, a base triggering PMOS transistor 1024, the Wilson current mirror 1020 (or a cascode current mirror 1050), PMOS transistor current source 1028 and 1026, a capacitor 1046, two control circuits 1030 and 1040, and a feedback line 1010 with following power-down transistors: a power-down inverter 1004, two power-down NMOS transistors 1012 and 1014, and a power-down PMOS transistor 1042. Two control circuits 1030 and 1040 are shown in FIG. 10 while the dotted line 1060 represents (i−2)

control circuits (not shown), where i is an integer ranging between 2 and n. So, there are totally n control circuits. The current-scaling binary-weighted control circuit array generates a bias current provided to the output through the Wilson current mirror 1020 by scaling the device aspect ratio of each triggering PMOS transistor in the control circuit array. $I_1$ through $I_n$ would be controlled by the binary bit coefficients associated with an N-bit digital input signal. Hence, the p-type controllable idle time current mirror circuit 900 provides the total current as FIG. 7, FIG. 8, and FIG. 9 do. The previous principle and operation of the control circuits 930 and 940 shown in FIG. 9 are applied to the control circuits 1030 and 1040 shown in FIG. 10. In addition, the capacitor 1046 is added to the drain of the triggering PMOS transistors to attenuate glitches since it provides additional paths to ground. Likewise, more additional capacitors can be added to necessary nodes shown in FIG. 10 to attenuate glitches.

For simplicity, it is again assumed that the p-type precisely controllable idle time current mirror circuit 1000 has only 2-bit control circuits. In addition, if $V_1$ and $V_2$ of control circuits 1030 and 1040 are zero with $V_{CB}=0$ the triggering PMOS transistors 1032 and 1062 are turned on. The sensing inverter 1002 senses a voltage at its input when the circuit mode changes from power-down mode to normal mode after its start-up. Since the higher-voltage sensing inverter 1002 initially senses $V_{DD}$, which is greater than the higher midpoint voltage, $V_{M(H)}$, of the higher-voltage sensing inverter 1002, the output voltage of the higher-voltage sensing inverter 1002 is low enough to turn on the triggering PMOS transistors 1024, 1032, and 1062. Thus, these three triggering PMOS transistors provide a total current to the output through the Wilson current mirror 1020 until the output voltage, $V_C$, goes down to the higher midpoint voltage, $V_{M(H)}$, which is decided by the device aspect ratios of the higher-voltage sensing inverter 1002. Thus, the triggering PMOS transistors finally provide a current, $I_{TOTAL}$, to the output so that $V_C$ goes down to the higher midpoint voltage, $V_{M(H)}$. So, the total current, $I_{TOTAL}$, flows out of the load and into the drains of the NMOS transistors 1006 and 1008. In addition, it is noted that the gate terminal of a PMOS transistor 1028 is connected to the output of the second inverter 1074 and the gate of a PMOS transistor 1026 is connected to a proper fixed-bias voltage (not shown) or a power supply voltage (e.g., $V_{DD}$, "1", high, etc.). $V_M$ is the lower midpoint voltage decided by the device aspect ratios of lower-voltage sensing inverter 1072. If $V_C$ is smaller than $V_M$, the PMOS transistor 1028 is turned on until $V_C$ goes up to $V_M$. In other words, current flows into the drains of the PMOS transistors 1026 and 1028 until $V_C$ goes up to $V_M$.

In two current mirrors 1020 and 1050 shown in FIG. 10, gates of transistors MN1 1006 and MN3 1016 are coupled each other and gates of transistors MN2 1008 and MN4 1018 are coupled each other. Especially in the Wilson current mirror 1020, the transistors MN3 1016 and MN2 1008 are diode-connected transistors. Those skilled in the art will recognize that with minor modifications, the diode-connected scheme may be modified with the transistors MN3 1066 and MN4 1068 serving as diode-connected transistors shown in the cascode current mirror 1050 of FIG. 10.

In the practical applications of the p-type precisely controllable idle time current mirror circuit of FIG. 10, it is also desirable to use a value for the higher midpoint voltage, $V_{M(H)}$, greater than $V_C{'}$ and a value for the lower midpoint voltage, $V_M$, smaller than $V_C{'}$. $V_C{'}$ is $V_C$ that makes the voltage-controlled oscillator's frequency (or the voltage-controlled delay line's frequency) equal to the input signal's frequency in the configuration where the voltage-controlled oscillator's frequency decreases proportionally to $V_C$ formed from a filter connected to a power supply voltage (e.g., $V_{DD}$, "1", high, etc.) and $V_C$. The CMOS process variations usually must be considered so that the proper value of the midpoint voltage is chosen for the p-type precisely controllable idle time current mirror circuit of FIG. 10. In addition, each bulk of four PMOS transistors in the current mirrors 1020 and 1050 can be connected to its own N-well to obtain better immunity from substrate noise.

Since the p-type power down mode of the p-type controllable idle time current mirror circuit of FIG. 9 is again applied to FIG. 10, one should use the voltage-controlled oscillator (or the voltage-controlled delay line) whose frequency decreases proportionally to $V_C$ formed from a filter connected to $V_{DD}$ and $V_C$ when $V_C$ is $V_{DD}$ during power-down mode.

In practice, the p-type precisely controllable idle time current mirror circuit of the present invention 1000 is used within the systems 602, 604, and 606. Assuming that three systems 602, 604, and 606, shown in FIG. 6, have the same p-type power-down mode as the circuit 1000 does, the phase-locked loop 602 including the circuit 1000 used for the block 608 can be simply termed the controllable idle time phase-locked loop. Likewise, the delay-locked loop 604 and the switching regulator 606 can be simply called the controllable idle time delay-locked loop and the controllable idle time switching regulator, respectively.

The p-type precisely controllable idle time current mirror circuit 1000 within the systems 602, 604, and 606 exhibits the same desirable features as the controllable idle time current mirror circuits 700, 800, and 900 within the systems 602, 604, and 606 exhibit. The systems 602, 604, and 606 including the circuit 1000 have the same advantages as the systems 602, 604, and 606 including the circuit 700, the circuit 800, or the circuit 900 have. To avoid redundancy, the statement of three desirable features and the advantages is omitted here, too. The present invention offers the above advantages by simply providing a p-type precisely controllable idle time current mirror circuit. Like the case for FIG. 7, FIG. 8, FIG. 9, the simulation time of each controllable idle time system using the p-type precisely controllable idle time current mirror of FIG. 10 can be reduced by a factor of 10.

In summary, the four types of the controllable idle time current mirror circuits 700, 800, 900, and 1000 of the present invention within the systems 602, 604, and 606 exhibits three desirable features as follows: 1. How fast the phase-locked loop becomes locked is controlled by an N-bit digital input and a device aspect ratio of each triggering NMOS transistor for a given filter. 2. How fast the delay-locked loop becomes locked is controlled by an N-bit digital input and a device aspect ratio of each triggering NMOS transistor for a given filter. 3. How fast the switching regulator comes in regulations is controlled by an N-bit digital input and a device aspect ratio of each triggering NMOS transistor for a given output load. The systems including four types of the circuits 700, 800, 900, and 1000 have the following advantages: a fast controllable lock-in time for phase-locked loops and delay-locked loops, a solution for harmonic locking problem of phase-locked loops, a prevention of delay-locked loops from failing to lock, a short controllable start-up time of switching regulators, a controllable reduction in power and time consumption until lock or regulation, a significant reduction in design time for better time-to-market, a higher performance, balance between two output resistances and capacitances at $V_C$, precision control, and an improvement in productivity by reusing the same cost-effective circuit for the systems 602, 604, and 606 such as controllable idle time phase-locked loop, controllable idle time delay-locked loop, and controllable idle time switching regulator. In addition, FIGS. 8 and 10 are highly effective for LC oscillator which has a very narrow tuning range. So far, it should be noted that the same time step has been used for the SPICE simulation in order to accurately measure and compare the simulation time of all circuits.

The present invention provides four types of the controllable idle time current mirror circuits. The controllable idle time current mirror circuits of the present invention yields the benefits and high efficiencies when implemented in system-on-chip (SOC), integrated circuits, monolithic circuits, or discrete circuits. The present invention, four types of the controllable idle time current mirror circuits, simply utilizes the Wilson (or cascade) current mirror and sensing gate instead of using complicated functional systems such as proportional integral controller or successive approximation registers. As a result, the present invention greatly reduces the cost, chip area, design simulation time, power, idle time, and complexity of systems by simply inserting a cost-effective controllable idle time current mirror circuit into the conventional systems including the conventional switching regulator 500 in order to achieve many advantages. While the present invention has been described in particular embodiments, it should be appreciated that the present invention should not be construed as being limited by such embodiments, but rather construed according to the claims below.

What is claimed is:

1. A controllable idle time current mirror circuit for making delay-locked loop become intelligently locked, comprising:
   a feedback line connected with the output and input of the controllable idle time current mirror circuit and also coupled to a filter;
   a sensing inverter for sensing a voltage at the feedback line and comparing with a midpoint voltage decided by device aspect ratios of the sensing inverter;
   n-bit current-scaling binary-weighted control circuit array for generating a total current corresponding to an N-bit digital input and a device aspect ratio of each triggering transistor;
   a current mirror for receiving a total current and providing the current to the feedback line; and
   a current source coupled to the feedback line.

2. The circuit as recited in claim 1 wherein power-down inverter and power-down transistors are further added to turn off all transistors and CMOS gates so that no current flows into the circuit during power-down mode.

3. The circuit as recited in claim 1 wherein an odd number of CMOS sensing inverters control the gates of triggering NMOS transistors coupled to the PMOS transistor current mirror.

4. The circuit as recited in claim 1 wherein an odd number of CMOS sensing inverters control the gates of triggering PMOS transistors coupled to the NMOS transistor current mirror.

5. The circuit as recited in claim 1 wherein an even number of CMOS sensing inverters directly control the gate of NMOS transistor if additional triggering transistors and current mirror are not added on the other control path.

6. The circuit as recited in claim 1 wherein an even number of CMOS sensing inverters directly control the gate of PMOS transistor if additional triggering transistors and current mirror are not added on the other control path.

7. The circuit as recited in claim 1 wherein the sensing inverter is comparator.

8. The circuit as recited in claim 1 wherein the sensing inverter is operational amplifier.

9. The circuit as recited in claim 1 wherein the sensing inverter is CMOS NAND gate since the two-input CMOS NAND gate can be used as an enabling inverter with one input serving as an active high enable input and the other used as the sensing input.

10. The circuit as recited in claim 1 wherein the sensing inverter is CMOS NOR gate since the two-input CMOS NOR gate can be used as an enabling inverter with one input serving as an active low enable input and the other used as the sensing input.

11. The circuit as recited in claim 1 wherein the sensing inverter is a lower-voltage sensing inverter for sensing a voltage at the feedback line and comparing with the lower midpoint voltage.

12. The circuit as recited in claim 1 wherein the sensing inverter is a higher-voltage sensing inverter for sensing a voltage at the feedback line and comparing with the higher midpoint voltage.

13. The circuit as recited in claim 1 wherein the sensing inverter is both higher-voltage sensing inverter and lower-voltage sensing inverter.

14. The circuit as recited in claim 1 wherein capacitors are added to necessary nodes.

15. The circuit as recited in claim 1 wherein the current mirror is the Wilson current mirror.

16. The circuit as recited in claim 1 wherein the current mirror is cascode current mirror.

17. The circuit as recited in claim 1 wherein the current mirror is simple current mirror.

18. The circuit as recited in claim 1 wherein the controllable idle time current mirror circuit is applied to all types of delay-locked loops without regard to architectures and schematics.

* * * * *